(12) United States Patent
Lindahl et al.

(10) Patent No.: US 12,031,207 B2
(45) Date of Patent: *Jul. 9, 2024

(54) COATED CUTTING TOOL

(71) Applicant: SANDVIK INTELLECTUAL PROPERTY AB, Sandviken (SE)

(72) Inventors: Erik Lindahl, Knivsta (SE); Linus Von Fieandt, Uppsala (SE)

(73) Assignee: Sandvik Intellectual Property AB, Sandviken (SE)

( * ) Notice: Subject to any disclaimer, the term of this patent is extended or adjusted under 35 U.S.C. 154(b) by 0 days.

This patent is subject to a terminal disclaimer.

(21) Appl. No.: 16/500,854

(22) PCT Filed: Mar. 26, 2018

(86) PCT No.: PCT/EP2018/057622
§ 371 (c)(1),
(2) Date: Oct. 4, 2019

(87) PCT Pub. No.: WO2018/184887
PCT Pub. Date: Oct. 11, 2018

(65) Prior Publication Data
US 2020/0141007 A1 May 7, 2020

(30) Foreign Application Priority Data
Apr. 7, 2017 (EP) .................... 17165547

(51) Int. Cl.
| C23C 16/36 | (2006.01) |
| C23C 16/40 | (2006.01) |
| C23C 28/04 | (2006.01) |
| C23C 30/00 | (2006.01) |

(52) U.S. Cl.
CPC ............ C23C 16/36 (2013.01); C23C 16/403 (2013.01); C23C 28/044 (2013.01); C23C 30/005 (2013.01); B23B 2224/32 (2013.01)

(58) Field of Classification Search
CPC ... C23C 28/042; C23C 28/044; C23C 28/048; C23C 28/40; C23C 28/42; C23C 28/44; C23C 30/005; C23C 16/36; C23C 14/0641; C23C 14/0658; C23C 14/0664

See application file for complete search history.

(56) References Cited

U.S. PATENT DOCUMENTS

| 5,871,850 | A | * | 2/1999 | Moriguchi | ............ C23C 30/005 501/87 |
| 5,915,162 | A | * | 6/1999 | Uchino | .................... C23C 16/36 75/235 |
| 5,942,318 | A | * | 8/1999 | Soderberg | ............. C23C 30/005 427/255.394 |
| 6,333,103 | B1 | * | 12/2001 | Ishii | ........................ C23C 16/30 51/307 |
| 6,756,111 | B1 | * | 6/2004 | Okada | .................... C23C 30/005 428/142 |
| 2004/0265541 | A1 | * | 12/2004 | Ruppi | ..................... C23C 16/36 428/335 |
| 2005/0013995 | A1 | * | 1/2005 | Ruppi | ..................... C23C 16/36 428/408 |
| 2006/0141271 | A1 | * | 6/2006 | Ruppi | ............... C23C 16/45523 427/248.1 |
| 2006/0222885 | A1 | * | 10/2006 | Fukano | ................. C23C 30/005 428/689 |
| 2008/0057280 | A1 | * | 3/2008 | Watanabe | ............... C23C 16/36 427/255.28 |

(Continued)

FOREIGN PATENT DOCUMENTS

| EP | 0732423 B1 | 9/1996 |
| EP | 1609883 A2 | 12/2005 |

(Continued)

OTHER PUBLICATIONS

Machine translation of JP 2012/196726 A, obtained from JPlat-Pat (Year: 2021).*
Machine translation of JP 2009/056538 A, obtained from JPlat-Pat (Year: 2021).*
Machine translation of JP 2009/056538 A.*
Machine translation of JP 2012/196726 A.*
Machine translation of JP 5672444 B.*

*Primary Examiner* — Z. Jim Yang
(74) *Attorney, Agent, or Firm* — Corinne R. Gorski

(57) ABSTRACT

A coated cutting tool includes a substrate coated with a multi-layered wear resistant coating having a layer of $\alpha$-$Al_2O_3$ and a layer of titanium carbonitride $Ti_xC_yN_{1-y}$, with $0.85 \leq x \leq 1.3$ and $0.4 \leq y \leq 0.85$, deposited on the $\alpha$-$Al_2O_3$ layer. The $Ti_xC_yN_{1-y}$ exhibits a texture coefficient TC(hkl), measured by X-ray diffraction using CuK$\alpha$ radiation and $\theta$-$2\theta$ scan. The TC(hkl) is defined according to Harris formula:

$$TC(hkl) = \frac{I(hkl)}{I_0(hkl)} \left[ \frac{1}{n} \sum_{n=1}^{n} \frac{I(hkl)}{I_0(hkl)} \right]^{-1},$$

wherein
I(hkl) is the measured intensity (integrated area) of the (hkl) reflection;
$I_0$(hkl) is standard intensity of the standard powder diffraction data according to JCPDS card no. 42-1489;
n is the number of reflections used in the calculation, and where the (hkl) reflections used are (1 1 1), (2 0 0), (2 2 0), (3 1 1), (3 3 1), (4 2 0) and (4 2 2), and wherein TC(1 1 1)$\geq$3.

12 Claims, No Drawings

(56) References Cited

U.S. PATENT DOCUMENTS

| | | | | |
|---|---|---|---|---|
| 2009/0123779 A1* | 5/2009 | Endler | | C23C 16/34 |
| | | | | 427/255.391 |
| 2010/0232893 A1* | 9/2010 | Imamura | | C23C 30/005 |
| | | | | 407/119 |
| 2011/0002749 A1* | 1/2011 | Ljungberg | | C23C 30/005 |
| | | | | 407/119 |
| 2011/0045283 A1* | 2/2011 | Holzschuh | | C23C 30/005 |
| | | | | 427/289 |
| 2012/0128971 A1* | 5/2012 | Shibata | | C23C 14/0664 |
| | | | | 204/192.12 |
| 2012/0225247 A1* | 9/2012 | Sone | | C23C 16/34 |
| | | | | 428/141 |
| 2012/0275870 A1* | 11/2012 | Paseuth | | C23C 28/044 |
| | | | | 407/119 |
| 2013/0287507 A1* | 10/2013 | Lind | | C23C 28/00 |
| | | | | 407/119 |
| 2014/0017469 A1 | 1/2014 | Fukunaga et al. | | |
| 2015/0003925 A1* | 1/2015 | Ostlund | | C23C 16/36 |
| | | | | 407/119 |
| 2015/0240353 A1 | 8/2015 | Fukunaga et al. | | |
| 2016/0175940 A1* | 6/2016 | Lindahl | | C23C 28/048 |
| | | | | 428/141 |
| 2016/0333473 A1* | 11/2016 | Stiens | | B23B 27/148 |
| 2017/0008092 A1* | 1/2017 | Ruppi | | C30B 29/68 |
| 2017/0029944 A1* | 2/2017 | Kubo | | C23C 28/048 |
| 2017/0275765 A1* | 9/2017 | Stiens | | C23C 16/34 |
| 2017/0342554 A1* | 11/2017 | Bjormander | | B23B 27/148 |
| 2018/0093331 A1* | 4/2018 | Paseuth | | C23C 28/044 |
| 2018/0105931 A1* | 4/2018 | Satoh | | C23C 28/044 |
| 2018/0216224 A1* | 8/2018 | Stiens | | C23C 16/36 |
| 2018/0237922 A1* | 8/2018 | Khatibi | | C23C 14/0676 |
| 2018/0258525 A1* | 9/2018 | Cho | | C23C 28/044 |
| 2019/0111497 A1* | 4/2019 | Stiens | | C23C 28/04 |
| 2019/0160547 A1* | 5/2019 | Takahashi | | B23B 27/148 |
| 2019/0314899 A1* | 10/2019 | Nakamura | | B23B 27/148 |
| 2020/0002819 A1* | 1/2020 | Stiens | | C23C 30/005 |
| 2020/0070253 A1* | 3/2020 | Fukushima | | C23C 16/403 |
| 2021/0138556 A1* | 5/2021 | Akesson | | C23C 28/044 |

FOREIGN PATENT DOCUMENTS

| | | | | |
|---|---|---|---|---|
| EP | 2570510 A1 | 3/2013 | | |
| EP | 2692466 B1 | 2/2014 | | |
| EP | 3034652 A1 | 6/2016 | | |
| EP | 3034653 A1 | 6/2016 | | |
| JP | H08158052 A | 6/1996 | | |
| JP | 2009056538 A * | 3/2009 | | |
| JP | 2009056538 B2 | 3/2009 | | |
| JP | 2012196726 A * | 10/2012 | | |
| JP | 5672444 B2 * | 2/2015 | | |
| JP | 2016137564 A | 6/2016 | | |
| WO | 2014198881 A1 | 12/2014 | | |
| WO | WO-2014198881 A1 * | 12/2014 | | C23C 16/36 |
| WO | 2016045937 A | 3/2016 | | |

* cited by examiner

COATED CUTTING TOOL

RELATED APPLICATION DATA

This application is a § 371 National Stage Application of PCT International Application No. PCT/EP2018/057622 filed Mar. 26, 2018 claiming priority to EP 17165547.5 filed Apr. 7, 2017.

TECHNICAL FIELD

The present disclosure relates to a coated cutting tool for chip forming machining of metals, more precisely a coated cutting tool comprising a substrate coated with a multi layered wear resistant coating comprising a layer of aluminum oxide and a layer of titanium carbonitride. The coated cutting tool in accordance with the present disclosure is particularly useful in applications with high demands of abrasive wear resistance in for example turning, milling or drilling of a metallic material such as alloyed steel, carbon steel or tough hardened steel.

BACKGROUND

Depositing thin, refractory coatings on cutting tools have been widely used in the machining industry for several decades. Coatings such as TiCN and $Al_2O_3$ have shown to improve the wear resistance on cutting inserts in cutting of many different materials. A combination on an inner layer of TiCN and an outer layer of $\alpha$-$Al_2O_3$ can be found on many commercial cutting tools designed for turning or milling of, for example, steel. However, as technology develops higher demands are set on the cutting tools. Thus, there exists a need for coated cutting tools having an improved wear resistance in metal cutting operations.

DISCLOSURE OF THE INVENTION

The present disclosure provides a coated cutting tool having improved performance in cutting operations, particularly a coated cutting tool having improved wear resistance, for example a higher resistance to crater wear and flank wear. The present disclosure further provides a method for producing a coated cutting tool having the above mentioned properties.

According to aspects illustrated herein, there is provided a coated cutting tool comprising a substrate coated with a multi-layered wear resistant coating comprising a layer of $\alpha$-$Al_2O_3$ and a layer of titanium carbonitride $Ti_xC_yN_{1-y}$ with $0.85 \leq x \leq 1.3$, preferably $1.1 \leq x \leq 1.3$, and $0.4 \leq y \leq 0.85$, deposited on the $\alpha$-$Al_2O_3$ layer, wherein the $Ti_xC_yN_{1-y}$ exhibits a texture coefficient TC(hkl), as measured by X-ray diffraction using CuK$\alpha$ radiation and $\theta$-$2\theta$ scan, the TC(hkl) being defined according to Harris formula:

$$TC(hkl) = \frac{I(hkl)}{I_0(hkl)} \left[ \frac{1}{n} \sum_{n=1}^{n} \frac{I(hkl)}{I_0(hkl)} \right]^{-1},$$

wherein
I(hkl) is the measured intensity (integrated area) of the (hkl) reflection;
$I_0$(hkl) is standard intensity of the standard powder diffraction data according to JCPDS card no. 42-1489;
n is the number of reflections used in the calculation, and where the (hkl) reflections used are (1 1 1), (2 0 0), (2 2 0), (3 1 1), (3 3 1), (4 2 0) and (4 2 2); and wherein TC(1 1 1) $\geq$ 3.

It has surprisingly been shown that the $Ti_xC_yN_{1-y}$ layer of a cutting tool according the present disclosure exhibits an unexpectedly high hardness. An increased hardness of a coating layer is typically associated with an improved wear resistance, such as crater wear and flank wear resistance. As used herein, the term cutting tool includes, but is not limited to, replaceable cutting tool inserts, indexable cutting tool inserts, but also solid cutting tools.

The present disclosure is based on the realization that by coating a cutting tool with a coating comprising a layer of $\alpha$-$Al_2O_3$ and a layer of titanium carbonitride $Ti_xC_yN_{1-y}$ deposited on top of the $\alpha$-$Al_2O_3$ layer, and where the $Ti_xC_yN_{1-y}$ is having a specifically preferred orientation, a cutting tool having a titanium carbonitride layer with an improved hardness, and thus an improved wear resistance in machining applications, can be achieved. More specifically, such properties can be achieved by a cutting tool with a coating comprising a layer of $\alpha$-$Al_2O_3$ and a layer of titanium carbonitride $Ti_xC_yN_{1-y}$ wherein the geometrically equivalent crystallographic planes {111} of the $Ti_xC_yN_{1-y}$ are found to be preferentially oriented parallel to the substrate, expressed herein as the texture coefficient TC (1 1 1) $\geq$ 3.

The $Ti_xC_yN_{1-y}$ layer is typically deposited with moderate temperature chemical vapor deposition (MTCVD) at a temperature of 600-900° C. The $\alpha$-$Al_2O_3$ is typically deposited by chemical vapor deposition (CVD) at a temperature of 800-1200° C. The $Ti_xC_yN_{1-y}$ layer is typically deposited immediately on top of the $Al_2O_3$ layer without an intermediate layer. However, the scope of the disclosure also includes embodiments comprising a thin intermediate layer present between the $Ti_xC_yN_{1-y}$ layer and the $\alpha$-$Al_2O_3$ layer. The grains of deposited $Ti_xC_yN_{1-y}$ and $\alpha$-$Al_2O_3$ are preferably columnar.

The coating according to the present disclosure furthermore provides and an excellent adhesion between the $Ti_xC_yN_{1-y}$ layer and underlying layers.

The multi-layer coating covers at least the area of the cutting tool that is engaged in cutting in a cutting operation, and at least the areas exposed for crater wear and/or flank wear. Alternatively, the whole cutting tool can be coated with the multi-layer coating of the present disclosure.

In some embodiments of the present disclosure the $\alpha$-$Al_2O_3$ layer exhibits a texture coefficient TC(hkl), as measured by X-ray diffraction using CuK$\alpha$ radiation an $\theta$-$2\theta$ scan, defined according to Harris formula wherein I(hkl) is the measured intensity (integrated area) of the (hkl) reflection, $I_0$(hkl) is standard intensity of the standard powder diffraction data according to JCPDS card no. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12); and TC(0 0 12) $\geq$ 7, preferably TC(0 0 12) $\geq$ 7.2. A high intensity from the (0 0 12) reflection has shown to be advantageous in that it is one way to promote a strong <1 1 1> texture of the subsequent $Ti_xC_yN_{1-y}$ layer.

In some embodiments the thickness of the $Ti_xC_yN_{1-y}$ layer is 1-10 μm, preferably 1-5 μm, more preferably 1-3 μm, most preferably 1-2 μm. The thickness of the $\alpha$-$Al_2O_3$ layer is 0.1-7 μm, preferably 0.1-5 μm or 0.1-2 μm or 0.3-1 μm.

In some embodiments the coating comprises a further layer of titanium carbonitride $Ti_uC_vN_{1-v}$, with $0.85 \leq u \leq 1.3$, preferably $1.1 \leq u \leq 1.3$, and $0.4 \leq v \leq 0.85$, located between the substrate and the α-Al$_2$O$_3$ layer. The Ti$_u$C$_v$N$_{1-v}$ layer can be deposited immediately on the substrate. However, the scope of this disclosure also includes embodiments comprising a thin intermediate layer between the substrate and the Ti$_u$C$_v$N$_{1-v}$ layer, such as a layer of TiN. Preferably, the Ti$_u$C$_v$N$_{1-v}$ is deposited by MTCVD at a temperature of 600-900° C. The thickness of the Ti$_u$C$_v$N$_{1-v}$ layer is typically 3-20 μm, preferably 3-10 μm or 3-7 μm or 3-5 μm.

In some embodiments, the Ti$_u$C$_v$N$_{1-v}$ layer located between the α-Al$_2$O$_3$ layer and the substrate exhibits a texture coefficient TC(hkl), as measured by X-ray diffraction using CuKα radiation and θ-2θ scan, defined according to Harris formula where I(hkl) is the measured intensity (integrated area) of the (hkl) reflection, I$_0$(hkl) is the standard intensity according to JCPDS card No. 42-1489, n is the number of reflections, the reflections used in the calculation are (1 1 1), (2 0 0), (2 2 0), (3 1 1), (3 3 1), (4 2 0) and (4 2 2); and wherein TC(4 2 2)≥3, preferably TC(4 2 2)≥3.5. In one embodiment, the Ti$_u$C$_v$N$_{1-v}$ layer exhibits a TC(3 1 1)+TC(4 2 2)≥4; ≥5; ≥6; or ≥7. A high intensity from the (4 2 2) reflection of the Ti$_u$C$_v$N$_{1-v}$ has shown to be advantageous in that it is one way to promote a strong <0 0 1> texture of the subsequent α-Al$_2$O$_3$ layer.

In some embodiments, the Ti$_x$C$_y$N$_{1-y}$ layer exhibits a higher mean hardness than the Ti$_u$C$_v$N$_{1-v}$ layer. The hardness is preferably measured by nano indentation using a Berkovich indenter, the hardness H being defined as H=(P/24.5h$_c^2$), wherein P is the maximum contact pressure exhibited by the indenter on the coating layer and h$_c$ is the is the depth of the indentation made by the indenter. The hardness measurement is made at a flat surface of the layer with an indentation in a direction perpendicular to the outer surface of the layer. The indentations are preferably made at a constant load of 3000 μN/min to a depth of h$_c$=110 nm.

In some embodiments the Ti$_x$C$_y$N$_{1-y}$ layer exhibits a mean hardness of more than 25 GPa, preferably more than 26 GPa, more preferably more than 27 GPa, even more preferably more than 30 GPa. The hardness is preferably measured by nano indentation using a Berkovich indenter, the hardness H being defined as H=(P/24.5h$_c^2$), wherein P is the maximum contact pressure exhibited by the indenter on the coating layer and h$_c$ is the is the depth of the indentation made by the indenter. The indentations are preferably made at a constant load of 3000 μN/min to a depth of h$_c$=110 nm. Other indenters known in the art may also be contemplated. A high hardness of the Ti$_x$C$_y$N$_{1-y}$ may be advantageous in that it provides the coated cutting tool with an improved wear resistance.

In some embodiments, the coating has a total thickness of 4-32 μm, preferably 4.5-20 μm or 5-15 μm.

In some embodiments, the substrate is selected from cemented carbide, cermet, ceramics, steel or cubic boron nitride. These substrates have hardnesses and toughnesses that suit the coating of the present disclosure.

In some embodiments, the substrate of the coated cutting tool consists of cemented carbide comprising 4-12 wt % Co, preferably 6-8 wt % Co, optionally 0.1-10 wt % cubic carbides, nitrides or carbonitrides of metals from groups IVb, Vb and VIb of the periodic table, preferably Ti, Nb, Ta or combinations thereof, and balance WC.

In some embodiments, the substrate is cemented carbide with a binder phase enriched surface zone. The thickness of the binder phase enriched surface zone is preferably 5-35 μm as measured from the surface of the substrate and towards the core of the substrate. The binder phase enriched zone has in average a binder phase content at least 50% higher than the binder phase content in the core of the substrate. A binder phase enriched surface zone enhances the toughness of the substrate. A substrate with a high toughness is preferred in cutting operations such as turning of steel.

In some embodiments, the substrate is cemented carbide with a surface zone essentially free from cubic carbides. The thickness of the surface zone essentially free from cubic carbides is preferably 5-35 μm as measured from the surface of the substrate and towards the core of the substrate. By "essentially free" means that no cubic carbides are visible in an ocular analysis of a cross section in a light optical microscope.

In some embodiments, the substrate is a cemented carbide with a binder phase enriched surface zone, as disclosed above, in combination with a surface zone essentially free from cubic carbides as disclosed above.

According to other aspects illustrated herein, there is also provided a method for producing a coated cutting tool having a substrate, the method comprising the steps of a) depositing a layer of Ti$_u$C$_v$N$_{1-v}$ by MTCVD at a temperature 600-900° C. on the substrate b) depositing a layer of α-Al$_2$O$_3$ by CVD at a temperature of 800-1200° C. on top of the Ti$_u$C$_v$N$_{1-v}$ layer;

c) depositing a layer of titanium carbonitride Ti$_x$C$_y$N$_{1-y}$ layer on top of the Al$_2$O$_3$ layer by MTCVD at a temperature 600-900° C. in an atmosphere comprising TiCl$_4$, CH$_3$CN, N$_2$ and H$_2$ at a partial pressure of 3-13 vol % H$_2$ and 83-94 vol % N$_2$, preferably 3-10 vol % H$_2$ and 85-93 vol % N$_2$, wherein the Ti$_x$C$_y$N$_{1-y}$ exhibits a texture coefficient TC(hkl), as measured by X-ray diffraction using CuKα radiation and θ-2θ scan, the TC(hkl) being defined according to Harris formula:

$$TC(hkl) = \frac{I(hkl)}{I_0(hkl)} \left[ \frac{1}{n} \sum_{n=1}^{n} \frac{I(hkl)}{I_0(hkl)} \right]^{-1},$$

wherein

I(hkl) is the measured intensity (integrated area) of the (hkl) reflection;

I$_0$(hkl) is standard intensity of the standard powder diffraction data according to JCPDS card no. 42-1489;

n is the number of reflections used in the calculation, and where the (hkl) reflections used are (1 1 1), (2 0 0), (2 2 0), (3 1 1), (3 3 1), (4 2 0) and (4 2 2); and wherein TC(1 1 1)≥3.

It has surprisingly been found that by using a low amount of H$_2$ in the CVD reactor a Ti$_x$C$_y$N$_{1-y}$ having a texture according to the present disclosure can be obtained. According to the present disclosure, a low amount of H$_2$ is supposed to denote an amount in the range 3-13 vol %, preferably 3-10 vol %. Furthermore, a high amount of N$_2$, such as in the range of 83-94 vol %, preferably 85-93 vol %, may be advantageous. The total gas pressure in the reactor is preferably around 80 mbar.

The coated cutting tool produced in accordance with the method may be further defined as set out above with reference to the inventive coated cutting tool. Particularly, the thickness of the Ti$_x$C$_y$N$_{1-y}$ coating layer may be 1-10 μm, preferably 1-5 μm, more preferably 1-3 μm, most preferably 1-2 μm.

In some embodiments the α-Al$_2$O$_3$ layer of the method preferably exhibits a texture coefficient TC(hkl), as measured by X-ray diffraction using CuKα radiation an θ-2θ scan, defined according to Harris formula wherein I(hkl) is the measured intensity (integrated area) of the (hkl) reflection, $I_0$(hkl) is standard intensity of the standard powder diffraction data according to JCPDS card no. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12); and TC(0 0 12)≥7, preferably TC(0 0 12)≥7.2.

In some embodiments of the method, the thickness of the $\alpha$-$Al_2O_3$ layer is preferably 0.1-7 µm, preferably 0.3-5 µm or 0.3-2 µm or 0.3-1 µm.

In some embodiments of the method, the thickness of the $Ti_uC_vN_{1-v}$ layer is 3-20 µm, preferably 3-10 µm or 3-7 µm or 3-5 µm.

In some embodiments of the method, the $Ti_uC_vN_{1-v}$ layer located between the $\alpha$-$Al_2O_3$ layer and the substrate exhibits a texture coefficient TC(hkl), as measured by X-ray diffraction using CuK$\alpha$ radiation and $\theta$-$2\theta$ scan, defined according to Harris formula where I(hkl) is the measured intensity (integrated area) of the (hkl) reflection, $I_0$(hkl) is the standard intensity according to JCPDS card No. 42-1489, n is the number of reflections, the reflections used in the calculation are (1 1 1), (2 0 0), (2 2 0), (3 1 1), (3 3 1), (4 2 0) and (4 2 2); and wherein TC(4 2 2)≥3.

In some embodiments of the method, the $Ti_xC_yN_{1-y}$ layer exhibits a higher mean hardness than the $Ti_uC_vN_{1-v}$ layer.

In some embodiments of the method, the $Ti_xC_yN_{1-y}$ layer exhibits a mean hardness of more than 25 GPa, preferably more than 26 GPa or more than 27 GPa.

In some embodiments of the method, the coating has a total thickness of 4-32 µm, preferably 4.5-20 µm or 5-15 µm.

In some embodiments of the method, the substrate is selected from cemented carbide, cermet, ceramics, steel or cubic boron nitride.

EXAMPLES

In the following, the coated cutting tool and method according to the present disclosure will be described more in detail by way of non-limiting examples.

Definitions and Methods

CVD Coatings

The CVD coatings were prepared in a radial flow reactor, type Bernex BPX 325S, having 1250 mm height and 325 mm diameter.

Texture Coefficient, TC

The crystallographic plane of a crystal is defined by the Miller indices, h, k, l. A means to express preferred growth, i. e. that one set of geometrically equivalent crystallographic planes {h k l} is found to be preferentially oriented parallel to the substrate, is the texture coefficient TC (h k l) calculated using the Harris formula on the basis of a defined set of XRD reflections measured on the respective sample. The intensities of the XRD reflections are standardized using a JCPDS card indicating the intensities of the XRD reflections of the same material, e. g. TiCN, but with random orientation, such as in a powder of the material. A texture coefficient TC (h k l)≥1 of a layer of crystalline material is an indication that the grains of the crystalline material are oriented with their {h k l} crystallographic plane parallel to the substrate surface more frequently than in a random distribution, at least compared to the XRD reflections used in the Harris formula to determine the texture coefficient TC.

The term "columnar" grains is herein intended to denote crystal grains that grow from the bottom of the layer towards the outer surface of the layer and that typically are extended in this direction. Columnar grains differ from equiaxed grains in that equiaxed grains continuously re-nucleates during growth of the layer.

X-Ray Diffraction (XRD) Measurements

The crystallography of the thin films, phase compositions and the out-of-plane orientations were evaluated by $\theta$-$2\theta$ X-ray diffraction using a Philips MRD-XPERT diffractometer equipped with a primary hybrid monochromator and a secondary x-ray mirror. Cu-K$\alpha$ radiation was used for the measurements, with a voltage of 45 kV and a current of 40 mA. Anti-scatter slit of ½ degree and a receiving slit of 0.3 mm were used. The diffracted intensity from the coated cutting tool was measured in the range 30° to 140° $2\theta$, i.e. over an incident angle $\theta$ range from 15 to 70°.

The data analysis, including background subtraction and profile fitting of the data, was done using PANalytical's X'Pert HighScore Plus software. The output (integrated peak areas for the profile fitted curve) from this program was then used to calculate the texture coefficients of the layer by comparing the ratio of the measured intensity data to the standard intensity data according to a JCPDS card of the specific layer (such as a layer of TiCN or $\alpha$-$Al_2O_3$), using the Harris formula as disclosed above.

Since the layer was a finitely thick film the relative intensities of a pair of peaks at different $2\theta$ angles are different than they are for bulk samples, due to the differences in path length through the layer. Therefore, thin film correction was applied to the extracted integrated peak area intensities for the profile fitted curve, taken into account also the linear absorption coefficient of layer, when calculating the TC values. Since possible further layers above for example the $Ti_xC_yN_{1-y}$ layer will affect the X-ray intensities entering the $Ti_xC_yN_{1-y}$ layer and exiting the whole coating, corrections need to be made for these as well, taken into account the linear absorption coefficient for the respective compound in a layer. The same applies for X-ray diffraction measurements of a $\alpha$-$Al_2O_3$ layer if the $\alpha$-$Al_2O_3$ layer is located below for example an $Ti_xC_yN_{1-y}$ layer. Alternatively, a further layer, such as TiN, above a $Ti_xC_yN_{1-y}$ layer can be removed by a method that does not substantially influence the XRD measurement results, e.g. chemical etching or mechanical polishing. In embodiments comprising a lower $Ti_uC_vN_{1-v}$ layer located between the $\alpha$-$Al_2O_3$ layer and the substrate the outer $Ti_xC_yN_{1-y}$ layer needs to be removed before making X-ray diffraction measurements of the lower $Ti_uC_vN_{1-v}$ layer.

Hardness Measurements

The hardness of the titanium carbonitride layer were measured using nanoindentation. The nanoindentation was performed using a CSM UNHT nanoindenter with a Berkovich tip diamond indenter. The indentations were made at a constant load of 3000 µN/min to a depth of $h_c$=110 nm. Hardness was measured at a flat outer surface or the layer after gentle surface polish (with 6 µm diamond slurry) to decrease the surface roughness. Equipment reference measurements were performed on fused silica to ensure optimal indenter performance. The hardness H being defined as $H=(P/24.5h_c^2)$, wherein P is the maximum contact pressure exhibited by the indenter on the coating layer and $h_c$ is the is the depth of the indentation made by the indenter. The indentation was made in a direction perpendicular to the surface of the layer. Any outer layers need to be removed with for example chemical etching or mechanical polishing before making the hardness measurement.

Example 1—$Ti_xC_yN_{1-y}$ on Sapphire

Sample Preparation and Analysis $Ti_xC_yN_{1-y}$ were grown on polished single crystal c-sapphire (001) substrates in a Bernex 325 hot wall CVD reactor, having 1250 mm height and 325 mm diameter at a temperature of 830° C.

The experimental conditions for the deposition of the coatings according to the present disclosure (sample 1 and 2) and for the comparative example (sample 3) are shown in table 1. The coatings were grown to a thickness of about 1.5 µm.

TABLE 1

| Experimental conditions in CVD chamber. | | | | |
| --- | --- | --- | --- | --- |
| MTCVD of $Ti_xC_yN_{1-y}$ (830° C.) | | | | |
| | Pressure [mbar] | $TiCl_4$ [vol %] | $CN_3CN$ [vol %] | $H_2$ [vol %] | $N_2$ [vol %] |
| Sample 1 (Inv) | 80 | 3.3 | 0.5 | 8.7 | 87.5 |
| Sample 2 (Inv) | 80 | 3.3 | 0.5 | 5.0 | 91.2 |
| Sample 3 (Ref.) | 80 | 3.3 | 0.5 | 96.2 | 0 |

X-Ray Diffraction (XRD Measurements) and Texture Coefficients

The $Ti_xC_yN_{1-y}$ layers of the coatings were analysed by XRD, and the texture coefficients of the (h k l) reflections (1 1 1), (2 0 0), (2 2 0), (3 1 1), (3 3 1), (4 2 0) and (4 2 2) of TiCN were determined as described herein. A thin film correction was applied to the XRD raw data. The results are shown in table 2.

TABLE 2

| Texture coefficients of $Ti_xC_yN_{1-y}$. | | | | | | |
| --- | --- | --- | --- | --- | --- | --- |
| Sample | TC(111) | TC(200) | TC(220) | TC(311) | TC(331) | TC(420) | TC(422) |
| 1 (Inv.) | 7.0 | 0.0 | 0.0 | 0.0 | 0.0 | 0.0 | 0.0 |
| 2 (Inv.) | 7.0 | 0.0 | 0.0 | 0.0 | 0.0 | 0.0 | 0.0 |
| 3 (Ref.) | 2.8 | 0.0 | 0.0 | 0.7 | 0.0 | 0.0 | 3.5 |

Hardness Measurements

The hardness of the $Ti_xC_yN_{1-y}$ layers was measured nanoindentation was performed using a CSM UNHT nanoindenter with a Berkovich tip diamond indenter and calculated as described herein above. The average hardness after 36 indentations were considered the coating hardness. The results are shown in table 3.

TABLE 3

| Hardness measurements. | |
| --- | --- |
| Sample | Average Hardness [GPa] |
| 1 (Inv.) | 37 |
| 2 (Inv.) | 36 |
| 3 (Ref.) | 22 |

Example 2—$Ti_xC_yN_{1-y}$ on Cemented Carbide

Sample Preparation and Analysis

Cemented carbide substrate of ISO-type CNMG120408 for turning was manufactured from 7.2 wt % Co, 2.7 wt % Ta, 1.8 wt % Ti, 0.4 wt % Nb, 0.1 wt % N and balance WC, comprising a Co enriched surface zone of about 25 µm from the substrate surface and to a depth into the body being essentially free from cubic carbides. The composition of the cemented carbide is thus about 7.2 wt % Co, 2.9 wt % TaC, 1.9 wt % TiC, 0.4 wt % TiN, 0.4 wt % NbC and 86.9 wt % WC.

The insert, sample 4, was first coated with a thin approximately 0.4 µm TiN-layer then with an approximately 12 µm $Ti_uC_vN_{1-v}$ layer by employing the well-known MTCVD technique using $TiCl_4$, $CH_3CN$, $N_2$, HCl and $H_2$ at 885° C. The volume ratio of $TiCl_4/CH_3CN$ in an initial part of the MTCVD deposition of the $Ti_uC_vN_{1-v}$ layer was 6.6, followed by a period using a ratio of $TiCl_4/CH_3CN$ of 3.7. The details of the TiN and the $Ti_uC_vN_{1-v}$ deposition are shown in Table 4.

TABLE 4

| MTCVD of TiN and $Ti_uC_vN_{1-v}$ deposition sample 4 | | | | | |
| --- | --- | --- | --- | --- | --- |
| MTCVD of TiN and $Ti_uC_vN_{1-v}$ (885° C.) | | | | | |
| | Pressure [mbar] | $H_2$ [vol %] | $N_2$ [vol %] | HCl [vol %] | $TiCl_4$ [vol %] | $CH_3CN$ [vol %] |
| TiN | 400 | 48.8 | 48.8 | — | 2.44 | — |
| $Ti_uC_vN_{1-v}$ inner | 55 | 59 | 37.6 | — | 2.95 | 0.45 |

TABLE 4-continued

| MTCVD of TiN and $Ti_uC_vN_{1-v}$ deposition sample 4 | | | | | |
| --- | --- | --- | --- | --- | --- |
| MTCVD of TiN and $Ti_uC_vN_{1-v}$ (885° C.) | | | | | |
| | Pressure [mbar] | $H_2$ [vol %] | $N_2$ [vol %] | HCl [vol %] | $TiCl_4$ [vol %] | $CH_3CN$ [vol %] |
| $Ti_uC_vN_{1-v}$ outer | 55 | 81.5 | 7.8 | 7.8 | 2.38 | 0.65 |

On top of the MTCVD $Ti_uC_vN_{1-v}$ layer a 1-2 µm thick bonding layer was deposited at 1000° C. by a process consisting of four separate reaction steps. First, a HTCVD $Ti_uC_vN_{1-v}$ step using $TiCl_4$, $CH_4$, $N_2$, HCl and $H_2$ at 400 mbar, then a second step (TiCNO-1) using $TiCl_4$, $CH_3CN$, CO, $N_2$ and $H_2$ at 70 mbar, then a third step (TiCNO-2) using $TiCl_4$, $CH_3CN$, CO, $N_2$ and $H_2$ at 70 mbar and finally a fourth step (TiCNO-3) using $TiCl_4$, CO, $N_2$ and $H_2$ at 70 mbar. During the third and fourth deposition steps some of the gases were continuously changed as indicated by a first start level and a second stop level presented in Table 5. Prior to the start of the subsequent $Al_2O_3$ nucleation, the bonding layer was oxidized at 55 mbar for 4 minutes in a mixture of $CO_2$, CO, $N_2$ and $H_2$. The details of the bonding layer deposition are shown in Table 5.

TABLE 5

Bonding layer deposition sample 4

| Bonding layer (1000° C.) | $H_2$ [vol %] | $N_2$ [vol %] | $CH_4$ [vol %] | HCl [vol %] | CO [vol %] | $TiCl_4$ [vol %] | $CH_3CN$ [vol %] | $CO_2$ [vol %] |
|---|---|---|---|---|---|---|---|---|
| HTCVD TiCN | 67.9 | 25.5 | 3.4 | 1.7 | — | 1.56 | — | — |
| TiCNO-1 | 83.7 | 12 | — | 1.2 | 1.2 | 1.5 | 0.4 | — |
| TiCNO-2 | 63.1-61.7 | 31.5-30.9 | — | — | 1.6-3.7 | 3.15-3.09 | 0.66-0.64 | — |
| TiCNO-3 | 62.1-61.5 | 31.1-30.8 | — | — | 3.7-4.6 | 3.11-3.08 | — | — |
| Oxidation | 53.8 | 30 | — | — | 12.5 | — | — | 3.7 |

On top of the bonding layer an $\alpha$-$Al_2O_3$ layer was deposited using CVD. All the $\alpha$-$Al_2O_3$ were deposited at 1000° C. and 55 mbar in two steps. The first step using 1.2 vol % $AlCl_3$, 4.7 vol % $CO_2$, 1.8 vol % HCl and balance $H_2$ giving about 0.1 μm $\alpha$-$Al_2O_3$ and a second step as disclosed below giving a total $\alpha$-$Al_2O_3$ layer thickness of about 10 μm.

The second step of the $\alpha$-$Al_2O_3$ layer was deposited using 1.2% $AlCl_3$, 4.7% $CO_2$, 2.9% HCl, 0.58% $H_2S$ and balance $H_2$, see table 6.

TABLE 6

Second $\alpha$-$Al_2O_3$ deposition step sample 4 (balance $H_2$)

| Sample | HCl [vol %] | $CO_2$ [vol %] | $H_2S$ [vol %] | $AlCl_3$ [vol %] |
|---|---|---|---|---|
| 4 | 2.9 | 4.7 | 0.58 | 1.2 |

On top of the $\alpha$-$Al_2O_3$ layer a 1.7 μm thick $Ti_xC_yN_{1-y}$ layer was deposited using MTCVD. The $Ti_xC_yN_{1-y}$ layer was deposited at 830° C. and 80 mbar using 3.3 vol % $TiCl_4$, 0.5 vol % $CH_3CN$, 8.75 vol % $H_2$ and balance $N_2$, see table 7.

TABLE 7

Outermost TiCN layer deposition

| | MTCVD of $Ti_xC_yN_{1-y}$ (830° C.) | | | | |
|---|---|---|---|---|---|
| | $TiCl_4$ [vol %] | $CN_3CN$ [vol %] | $H_2$ [vol %] | $N_2$ [vol %] | Growth rate [μm/min] |
| Sample 4 (Inv) | 3.3 | 0.5 | 8.8 | 87.5 | 0.67 |

X-Ray Diffraction (XRD Measurements) and Texture Coefficients

The outermost $Ti_xC_yN_{1-y}$ layer, the inner $Ti_uC_vN_{1-v}$ layer and the $\alpha$-$Al_2O_3$ layer of the coating was analyzed by XRD, and the texture coefficients of the (h k l) reflections were determined as described herein. A thin film correction was applied to the XRD raw data. The results are shown in tables 8-10.

TABLE 8

Texture coefficients of the outermost TiCN layer of Sample 4

| (h k l) | TC |
|---|---|
| (111) | 3.41 |
| (200) | 0.00 |
| (220) | 0.04 |
| (311) | 0.37 |

TABLE 8-continued

Texture coefficients of the outermost TiCN layer of Sample 4

| (h k l) | TC |
|---|---|
| (331) | 0.16 |
| (420) | 0.23 |
| (422) | 2.81 |

TABLE 9

Texture coefficients of the inner TiCN layer of Sample 4

| (h k l) | TC |
|---|---|
| (111) | 0.03 |
| (200) | 0.00 |
| (220) | 0.02 |
| (311) | 1.08 |
| (331) | 0.16 |
| (420) | 0.04 |
| (422) | 5.67 |

TABLE 10

Texture coefficients of the $\alpha$-$Al_2O_3$ layer of Sample 4

| (h k l) | TC |
|---|---|
| (104) | 0.00 |
| (110) | 0.05 |
| (113) | 0.00 |
| (024) | 0.00 |
| (116) | 0.00 |
| (214) | 0.00 |
| (300) | 0.00 |
| (0 0 12) | 7.95 |

Hardness Measurements

The hardness of the outermost $Ti_xC_yN_{1-y}$ layer was measured by nanoindentation was performed using a CSM UNHT nanoindenter with a Berkovich tip diamond indenter and calculated as described herein above. The average hardness after 15 indentations were considered the hardness of the outermost $Ti_xC_yN_{1-y}$ layer. The average hardness of the outermost $Ti_xC_yN_{1-y}$ layer was measured to 26.7 GPa.

The invention claimed is:

1. A coated cutting tool comprising a substrate coated with a multi-layered wear resistant coating including a layer of $\alpha$-$Al_2O_3$ and a MTCVD layer of titanium carbonitride $Ti_xC_yN_{1-y}$, with $0.85 \leq x \leq 1.3$—and $0.4 \leq y \leq 0.85$, deposited on the $\alpha$-$Al_2O_3$ layer, wherein the MTCVD $Ti_xC_yN_{1-y}$ layer exhibits a mean hardness of 25-37 GPa, and wherein the $Ti_xC_yN_{1-y}$ exhibits a texture coefficient TC(hkl), as measured by X-ray diffraction using CuK$\alpha$ radiation and $\theta$-$2\theta$ scan, the TC(hkl) being defined according to Harris formula:

$$TC(hkl) = \frac{I(hkl)}{I_0(hkl)} \left[ \frac{1}{n} \sum_{n=1}^{n} \frac{I(hkl)}{I_0(hkl)} \right]^{-1},$$

wherein
I(hkl) is the measured intensity (integrated area) of the (hkl) reflection;
$I_0$(hkl) is standard intensity of the standard powder diffraction data according to JCPDS card no. 42-1489;
n is the number of reflections used in the calculation, and where the (hkl) reflections used are (1 1 1), (2 0 0), (2 2 0), (3 1 1), (3 3 1), (4 2 0) and (4 2 2); TC(1 1 1)$\geq$3; and
wherein the $\alpha$-$Al_2O_3$ layer exhibits a texture coefficient TC(hkl), as measured by X-ray diffraction using CuK$\alpha$ radiation an $\theta$-$2\theta$ scan, defined according to Harris formula, wherein I(hkl) is the measured intensity (integrated area) of the (hkl) reflection, $I_0$(hkl) is standard intensity of the standard powder diffraction data according to JCPDS card no. 00-010-0173, n is the number of reflections used in the calculation, and where the (hkl) reflections used are (1 0 4), (1 1 0), (1 1 3), (0 2 4), (1 1 6), (2 1 4), (3 0 0) and (0 0 12) and TC(0 0 12)$\geq$7.

2. The coated cutting tool according to claim 1, wherein the thickness of the MTCVD $Ti_xC_yN_{1-y}$ layer is 1-10 $\mu$m.

3. The coated cutting tool according to claim 1, wherein the thickness of the $\alpha$-$Al_2O_3$ layer is 0.3-7 $\mu$m.

4. The coated cutting tool according to claim 1, wherein the coating includes a further layer of titanium carbonitride $Ti_uC_vN_{1-v}$, with $0.85 \leq u \leq 1.3$, and $0.4 \leq v \leq 0.85$, located between the substrate and the $\alpha$-$Al_2O_3$ layer.

5. The coated cutting tool according to of claim 4, wherein the thickness of the $Ti_uC_vN_{1-v}$ layer is 3-20 $\mu$m.

6. The coated cutting tool according to claim 4, wherein the $Ti_uC_vN_{1-v}$ layer located between the $\alpha$-$Al_2O_3$ layer and the substrate exhibits a texture coefficient TC(hkl), as measured by X-ray diffraction using CuK$\alpha$ radiation and $\theta$-$2\theta$ scan, defined according to Harris formula where I(hkl) is the measured intensity (integrated area) of the (hkl) reflection, $I_0$(hkl) is the standard intensity according to JCPDS card No. 42-1489, n is the number of reflections, the reflections used in the calculation are (1 1 1), (2 0 0), (2 2 0), (3 1 1), (3 3 1), (4 2 0) and (4 2 2), and wherein TC(4 2 2)$\geq$3.

7. The coated cutting tool according to claim 4, wherein the MTCVD $Ti_xC_yN_{1-y}$ layer exhibits a higher mean hardness than the $Ti_uC_vN_{1-v}$ layer.

8. The coated cutting tool according to claim 1, wherein the coating has a total thickness of 4-32 $\mu$m.

9. The coated cutting tool according to claim 1, wherein the substrate is selected from cemented carbide, cermet, ceramics, steel or cubic boron nitride.

10. The coated cutting tool of claim 1, wherein the $\alpha$-$Al_2O_3$ layer and the $Ti_xC_yN_{1-y}$ layer are columnar.

11. The coated cutting tool of claim 1, wherein the $\alpha$-$Al_2O_3$ layer and the $Ti_xC_yN_{1-y}$ layer are deposited by chemical vapor deposition (CVD).

12. A method for producing a coated cutting tool having a substrate, the method comprising the steps of
a) depositing a layer of $Ti_uC_vN_{1-v}$ by MTCVD at a temperature of 600-900° C. on the substrate;
b) depositing a layer of $\alpha$-$Al_2O_3$ by CVD at a temperature of 800-1200° ° C. on top of the $Ti_uC_vN_{1-v}$ layer;
c) depositing a layer of titanium carbonitride $Ti_xC_yN_{1-y}$ layer on top of the $Al_2O_3$ layer by MTCVD at a temperature of 600-900° C. in an atmosphere comprising $TiCl_4$, $CH_3CN$, $N_2$ and $H_2$ in an amount of 3-13 vol % $H_2$ and 83-94 vol % $N_2$, wherein the MTCVD $Ti_xC_yN_{1-y}$ layer exhibits a mean hardness of 25-37 GPa, and wherein the $Ti_xC_yN_{1-y}$ exhibits a texture coefficient TC(hkl), as measured by X-ray diffraction using CuK$\alpha$ radiation and $\theta$-$2\theta$ scan, the TC(hkl) being defined according to Harris formula:

$$TC(hkl) = \frac{I(hkl)}{I_0(hkl)} \left[ \frac{1}{n} \sum_{n=1}^{n} \frac{I(hkl)}{I_0(hkl)} \right]^{-1},$$

wherein
I(hkl) is the measured intensity (integrated area) of the (hkl) reflection;
$I_0$(hkl) is standard intensity of the standard powder diffraction data according to JCPDS card no. 42-1489;
n is the number of reflections used in the calculation, and where the (hkl) reflections used are (1 1 1), (2 0 0), (2 2 0), (3 1 1), (3 3 1), (4 2 0) and (4 2 2); and
wherein TC(1 1 1)$\geq$3.

* * * * *